United States Patent [19]

Smith

[11] Patent Number: 5,736,900
[45] Date of Patent: Apr. 7, 1998

[54] METHOD AND APPARATUS FOR AMPLIFYING AN ELECTRICAL SIGNAL

[75] Inventor: Douglas L. Smith, Tucson, Ariz.

[73] Assignees: Maxim Integrated Products, Sunnyvale, Calif.; Gain Technology Corp., Tucson, Ariz.

[21] Appl. No.: 666,859

[22] Filed: Jun. 19, 1996

Related U.S. Application Data

[60] Provisional application No. 60/000,716, Jun. 30, 1995 and provisional application No. 60/000,726, Jun. 30, 1995.

[51] Int. Cl.$^6$ ...................................................... H03F 1/34
[52] U.S. Cl. ........................... 330/265; 330/85; 330/293; 330/294
[58] Field of Search ......................... 330/85, 100, 103, 330/107, 265, 271, 292, 293, 294

[56] References Cited

U.S. PATENT DOCUMENTS

| | | | |
|---|---|---|---|
| 4,080,580 | 3/1978 | Takasaki et al. | 330/103 X |
| 4,366,442 | 12/1982 | Yamada | 330/265 X |
| 4,371,843 | 2/1983 | Fang et al. | 330/253 |
| 4,751,474 | 6/1988 | Gola | 330/292 |
| 5,121,080 | 6/1992 | Scott, III et al. | 330/85 |
| 5,418,495 | 5/1995 | Harvey | 330/265 |
| 5,477,190 | 12/1995 | Brehmer et al. | 330/292 X |

FOREIGN PATENT DOCUMENTS

| 50148 | 4/1977 | Japan | 330/100 |
|---|---|---|---|

OTHER PUBLICATIONS

Walker, "Current Dumping Audio Amplifier", *Wireless World*, vol. 81, No. 1480, pp. 560–562 Dec. 1975.
Smith, Douglas Lee, "High Speed Operational Amplifier Architectures," IEEE 1993 Bipolar Circuits and Technology Meeting, pp. 141–148.

*Primary Examiner*—James B. Mullins
*Attorney, Agent, or Firm*—Hickman Beyer & Weaver, LLP

[57] ABSTRACT

In accordance with the objectives of the present invention, a variety of apparatus and methods for amplifying an electrical signal are disclosed. According to one embodiment of the present invention, a dual-output stage amplifier includes an amplifier stage having an input and an output, a first output stage having an input and an output, a second output stage having an input and an output and an error stage having an input and an output. The first output stage output is coupled with the output of the amplifier stage and responsive to the amplifier stage. If the first output stage output is coupled to an output load, the first output stage is capable of providing an output current to the output load such that a first output voltage related to an input voltage at the input of the amplifier stage is maintained across the output load. In turn, the second output stage input is coupled with the output of the amplifier stage and in parallel with the first output stage. Additionally, the second output stage output is coupled to the input of the error stage while the output of the error stage is coupled to the input of the amplifier stage. As taught by the present invention, the error stage is capable of providing a feedback current to the amplifier stage input such that a difference between a second output voltage generated by the second output stage and a desired second output voltage is reduced.

18 Claims, 7 Drawing Sheets

METHOD AND APPARATUS FOR AMPLIFYING AN ELECTRICAL SIGNAL

DESCRIPTION

CROSS-REFERENCE TO RELATED APPLICATION

This application claims the benefit of Smith's copending U.S. Provisional patent application No. 60/000,716, entitled "METHOD AND APPARATUS FOR AMPLYFYING AN ELECTRICAL SIGNAL," filed Jun. 30, 1995, which is incorporated herein by reference in its entirety.

This application is related to Smith's copending U.S. Provisional patent application Ser. No. 60/000,726, entitled "AN OUTPUT STAGE FOR BUFFERING AN ELECTRICAL SIGNAL AND METHOD FOR PERFORMING THE SAME," filed Jun. 30, 1995, which is incorporated herein by reference in its entirety.

TECHNICAL FIELD

The present invention is related to electronic amplifiers. More particularly, multiple output stage amplifiers which provide a first output stage for driving an error stage and a second output stage for driving an output load are contemplated.

BACKGROUND ART

In electronic devices, it is very common to connect the output of one circuit to the input of another circuit. The output signal source might be an output terminal of an amplifier stage driving a next stage (which may be more circuitry or perhaps an electro-mechanical device such as a audio speaker) having a load impedance $Z_L$. In general, the loading effect $Z_L$ of the following stage causes reduction and/or nonlinearities in a gain and a phase response of the amplifier stage. The result is an output signal which has both a distorted magnitude and a distorted phase.

Even without a significant load $Z_L$, realizable amplifier stages do not necessarily exhibit their desired, theoretical behavior. Instead, most realizable amplifiers are nonlinear devices which distort their output signals. Accordingly, amplifier stages are sometimes designed with additional circuitry intended to minimize signal distortion without altering the desired gain and phase properties of the amplifier.

Historically, a primary focus of the amplifier designer has been on elimination of gain distortion. In essence, this has been driven by two factors. First, the causes of phase distortion require more sophisticated analysis. Second, and perhaps most importantly, past applications have relied mainly on the magnitude of the output signal, often ignoring the phase component. Hence, even if phase distortion was present in the output signal, it was not a significant problem. A few example technologies in which the presence of phase distortion is typically not an issue include audio, radio, telecommunications, and electromechanical technology such as that utilized in strain gauges.

However, as the information encoded in electronic signals has become increasingly complex, the strategies for encoding information have become correspondingly sophisticated. Specifically, many situations now exist wherein both the gain and phase components of an electrical signal carry vital information. Take, for example, composite video technology. The information carried by a composite video signal consists of hue, saturation, and luminescence. In particular, the phase component of the composite video signal often contains the hue information. Thus phase distortion results in hue distortion.

With reference to FIG. 1, a common three stage amplifier 10 of the prior art will be described. The amplifier 10 includes an input 12, an output 14, a converting stage 16, a load resistor $R_{L1}$, an inverting stage 20, and a buffer output stage 22. The converting stage 16 is coupled to the input 12 and receives an input signal having a voltage $V_{IN}$ present on the input. The converting stage 16 then converts the voltage $V_{IN}$ to a current signal through a transconductance A1 (voltage to current gain) and transmits this current to the load resistor $R_{L1}$. The resistor $R_{L1}$ is coupled together with both the converting stage 16 and the inverting stage 20 at one end of the resistor, and to a ground reference 24 at the resistor $R_{L1}$'s other end. Thus the current generated by the converting stage is reconverted to a second voltage which is received by the inverting stage 20.

In turn, the inverting stage 20 amplifies the second voltage by a gain $-A2$ to generate a third voltage transmitted to the buffer output stage 22. The buffer output stage typically has a gain $A3=1$; thus the total gain $A_T$ of the common three stage amplifier 10 is $-A1*R_{L1}*A2$.

As is well familiar to those skilled in the art of amplifier design, both gains A1 and A2 are frequency dependent parameters that introduce signal response poles and generally degrade stability under feedback conditions. That is, if the amplifier 10 is incorporated into an electrical system which utilizes feedback, the signal response pole introduced by gains A1 and A2 will degrade the overall performance of the electrical system. Additionally, gain A3 can vary with the output load demand, generating distortion in the output signal whether or not the amplifier 10 is utilized within a feedback system.

Turning next to FIG. 2, another amplifier 35 of the prior art will be described. The amplifier 35 is a common attempt to modify FIG. 1 through feedback providing phase compensation. A capacitor $C_C$ is connected around the output of the inverting stage 20 and coupled to the input of the inverting stage 20 and to the resistor $R_{L1}$. The capacitor $C_C$ supplies a negative feedback current $I_{FB}$ to the resistor $R_{L1}$ to produce a well known phase compensation pole at the frequency $f_C=1/(2*\pi*R_{L1}*A2*C_C)$. Here, the gain A2 of the inverting stage 20 amplifies the capacitance Cc delivering an equivalent capacitance of $A2*C_C$. As a result, the value of $C_C$ actually required for successful phase compensation reduces to a level realizable with integrated circuit fabrication.

While the introduction of $C_C$ may result in beneficial phase compensation and perhaps more stable feedback systems, the feedback through $C_C$ introduces significant distortion and may limit a slewing rate of the amplifier 35. By way of explanation, the distortion results from an interaction between an output resistance $R_{o2}$ of the inverting stage 20 and a parasitic capacitance $C_P$ coupled to the ground reference 24. The parasitic capacitance $C_P$ is introduced by $C_C$. As will be appreciated by those skilled in the art, parasitic capacitance such as $C_P$ is generated during most integrated circuit fabrication processes and is due to a standard junction isolation technique.

The parasitic capacitance $C_P$ is generated at a point in the structure of amplifier 35 where the full voltage $V_{OUT}$ of the output signal will drop across $C_P$. Accordingly, a resulting parasitic capacitive current $I_P$ develops causing an error voltage with the output resistance $R_{o2}$ of the inverting stage 20. If the error voltage were constant it would be a determinable offset (i.e. a constant error as opposed to distortion) for which could be compensated (say by adding a correction signal or tuning a larger feedback system in which the amplifier 35 is present). However, the magnitude of the parasitic capacitance $C_P$ is not constant, but rather, it varies with the voltage drop across $C_P$. Hence, the error in the output signal varies with the magnitude input voltage. That is, the output signal is distorted.

As mentioned above, the $C_C$ connection also effects the slewing rate for the amplifier 35. As will be appreciated by those skilled in the art, an amplifier's slewing rate defines the maximum rate of change in voltage across the input and output terminals of the amplifier and is normally expressed in volts per second (dV/dt). It will now be shown that the amplifier 35 of FIG. 2 produces a slewing-rate versus current efficiency compromise.

A signal on the output of the inverting amplifier has a voltage $V_2$ and a current $I_2$. Since, typically, $V_2 \gg V_{IN}$, the voltage swing across $C_C$ is relatively large. Essentially, it can be claimed that $V_{CC} \approx V_2$. An output slewing rate of dV/dt implies a minimum current supply from the inverting amplifier 20 of $I_2 \approx (C_C + C_P) * dV/dt$. However, voltage gain stages such as the inverting amplifier 20 typically have output current limits determined by the level of their quiescent currents (provided by, e.g., the amplifiers internal, substantially constant, biasing current source). Thus a voltage gain stage in an amplifier which has capacitive (or other) feedback will potentially limit the slewing rate at a level related to the amplifier's quiescent current. Increasing the quiescent current of the amplifier will raise the limit, but only by compromising on current efficiency.

With reference to FIG. 3, an amplifier 40 which is a prior art attempt to compensate for the distortion and slewing problems of FIG. 2 will be described. The amplifier 40 compensates for the relatively high output resistance of the inverting amplifier 20 by coupling the feedback capacitor $C_C$ to the output of the buffer amplifier stage 22 (instead of the inverting amplifier 20).

As will be appreciated, the electrical characteristics of the buffer amplifier stage 22 make it more suitable (in some ways) for providing the feedback current $I_{FB}$ than the inverting stage 20. For example, the internal resistance $R_{o3}$ is usually much smaller than $R_{o2}$ as the buffer amplifier stage is intended to provide the large output current $I_{OUT}$. Thus the capacitive current $I_P$ drawn through $C_P$ in the amplifier 40 will be much smaller than that drawn in amplifier 35 of FIG. 2. Accordingly, the voltage error across $C_C$ of FIG. 3 will be smaller than the voltage error across $C_C$ of FIG. 2. Furthermore, since the buffer amplifier stage 22 is intended to drive the output load, it typically has a much larger quiescent current. The larger available output current results in an improved skewing rate dV/dt.

While an improvement to the gain distortion of FIG. 2, the amplifier 40 of FIG. 3 retains a significant gain distortion and introduces a subtle phase distortion as a result of the variability of the output resistance $R_{o3}$ of the buffer amplification stage 22. As will be appreciated by those skilled in the art, the higher load currents necessary for driving the output load $R_{L3}$ cause significant variation in the output resistance $R_{o3}$.

Neglecting the circuit capacitance (which only worsens the distortion), the effect of $R_{o3}$ on the gain of the amplifier 40 can be determined as follows. In an ideal amplifier 40, the total gain $A_T = -A1 * A2 * A3$. However, the output resistance $R_{o3}$ forms a voltage divider with the output load $R_{L3}$. This implies an actual gain $A3' = A3 * [R_{L3}/(R_{L3} + R_{o3})]$, where $R_{L3}/(R_{L3} + R_{o3}) < 1$. For a typical output stage 22, the output resistance $R_{o3} = V_t/I_L$ where, as will be appreciated by those skilled in the art, $V_t$ is the semiconductor thermal voltage of the output stage 22. Inserting $V_t/I_L$ for $R_{o3}$ yields $A3' = A3 * [R_{L3}/(R_{L3} + V_t/I_L)]$ which illustrates the dependence of A3 upon the load current $I_L$. The resulting gain variation with signal variation produces signal distortion.

While less obvious, the A3 gain variation produces a significant source of phase distortion as follows. Similar to FIG. 2, connecting the feedback capacitor $C_C$ across the output 14 and back to the input 12 introduces a frequency compensation pole at the frequency $f_C = 1/(2 * \pi * R_{L1} * A2 * A3' * C_C)$. Thus the above described variations in the actual gain A3'of the output stage 22 result in distortion in the phase of the output signal related to the input signal.

FIG. 4 illustrates another prior art power amplifier 44 which substantially eliminates the aforementioned phase distortion by introducing an isolation stage 30. The isolation stage 30 eliminates the dependence of A3 upon the load current $I_L$ by isolating the feedback capacitor $C_C$ from the output stage 22. Because of the isolation, the gain product A2*A3 that influences the $f_C$ pole frequency is immune to the effects of load current $I_L$. Nevertheless, the amplifier 44 reintroduces some gain distortion and further leaves a couple of issues unresolved.

Because the amplifier 44 has no error control circuitry in direct relation to its output 14 (e.g., feedback or feedforward), no gain correction is provided. Unfortunately, the $I_L$ current demands produce gain distortion through the inevitable output resistance modulation of the load-driving output stage 22. Thus the amplifier 44 provides an improvement in phase distortion only at the expense of greater gain distortion.

Furthermore, an isolation current $I_{ISO}$ driving the feedback capacitor $C_C$ still loads the isolation stage 30 causing distortion therein. As will be apparent, any distortion in the isolation stage 30 causes a corresponding distortion at the output 14.

DISCLOSURE OF THE INVENTION

In accordance with the objectives of the present invention, a variety of apparatus and methods for amplifying an electrical signal are disclosed.

According to one embodiment of the present invention, a dual-output stage amplifier includes an amplifier stage having an input and an output, a first output stage having an input and an output, a second output stage having an input and an output and an error stage having an input and an output. The first output stage output is coupled with the output of the amplifier stage and responsive to the amplifier stage. If the first output stage output is coupled to an output load, the first output stage is capable of providing an output current to the output load such that a first output voltage related to an input voltage at the input of the amplifier stage is maintained across the output load.

In turn, the second output stage input is coupled with the output of the amplifier stage and in parallel with the first output stage. Additionally, the second output stage output is coupled to the input of the error stage while the output of the error stage is coupled to the input of the amplifier stage. As taught by the present invention, the error stage is capable of providing a feedback current to the amplifier stage input such that a difference between a second output voltage generated by the second output stage and a desired second output voltage is reduced. In order to provide this operability, the error stage has a gain operable to amplify an electrical signal applied at the error stage input. The gain of the error stage may have a current gain greater than unity, a voltage gain greater than unity, or may have both a current gain and a voltage gain greater than unity.

In another, separate embodiment of the present invention, a multiple amplification stage amplifier is disclosed. The multiple amplification stage amplifier includes an input amplification stage having an input and an output, a plurality of successive amplification stages each having an input and an output, a plurality of error stages each having an input and an output and corresponding to a unique one of the plurality of successive amplification stages, and an output stage having an input and an output.

The input of a first one of the plurality of successive amplification stages is connected to the output of the input amplification stage and further, with the exception of a last one of the plurality of successive amplification stages, the output of any given amplification stage is connected to the input of a next amplification stage immediately subsequent to the given amplification stage. Thus, with the exception of the last amplification stage, each amplification stage drives a single, next amplification stage.

Further in the present embodiment, each error stage output is connected to the input amplification stage input and each error stage output is connected to the output of its corresponding unique amplification stage. The present embodiment further teaches that any given error stage is capable of providing a feedback current to the amplification stage input such that a difference between a voltage generated at the output of its corresponding amplification stage and a desired voltage is reduced.

Additionally, the output stage input is coupled with the input of the last amplification stage, and, if the output stage output is coupled to an output load, the output stage is capable of providing an output current to the output load such that an output voltage related to an input voltage at the input of the input amplification stage is maintained across the amplifier load.

In a separate embodiment of the present invention, a power amplifier comprising, a power amplifier input coupled to an input signal having a voltage $V_{IN}$ and a current $I_{IN}$, a power amplifier output at which an output signal is generated having a voltage $V_{OUT}$ and a current $I_{OUT}$, an amplifier stage coupled to the power amplifier input and responsive to the input signal to generate an amplified signal having a voltage $V_{AMP}$ and $I_{AMP}$, an isolation stage coupled to the amplifier stage and responsive to the amplified signal to generate an isolated signal having a voltage $V_{ISO}$ and $I_{ISO}$, an error stage coupled between the isolation stage and the power amplifier input and responsive to a difference between the $V_{ISO}$ and a desired $V_{ISO}$ to generate a feedback current $I_{FB}$ operative to modify the input signal such that the difference between the $V_{ISO}$ and the desired $V_{ISO}$ is reduced and a difference between the $V_{OUT}$ and a desired $V_{out}$ is also reduced, an output stage coupled between the amplifier stage and the power amplifier output and responsive to the amplified signal to generate the output signal, and a current dumping resistor $R_{CD}$ coupled between the isolation stage and the power amplifier output is disclosed. According to this embodiment, a voltage difference between $V_{ISO}$ and $V_{OUT}$ generates a current flowing through the resistor $R_{CD}$ which is included in $I_{OUT}$.

In accordance with one aspect of the present invention, a method is taught for amplifying an electrical signal, the method including the steps of receiving an input signal having a voltage $V_{IN}$ and a current $I_{IN}$, generating an amplified signal having a voltage $V_{AMP}$ and a current $I_{AMP}$ related to the input signal, generating an isolated signal having a voltage $V_{ISO}$ and a current $I_{ISO}$ related to the amplified signal, generating an output signal having a voltage $V_{OUT}$ related to the amplified signal and a current $I_{OUT}$ related to an output load, sensing a difference between the voltage $V_{ISO}$ and a desired $V_{ISO}$, and, generating a feedback current $I_{FB}$ related to the difference between the voltage $V_{ISO}$ and the desired $V_{ISO}$. Furthermore, the present invention teaches that when the current $I_{FB}$ is included into the current $I_{IN}$, the difference between the voltage $V_{ISO}$ and the desired $V_{ISO}$ is reduced and, further, a difference between the voltage $V_{OUT}$ and a desired $V_{OUT}$ is reduced.

BEST MODES FOR CARRYING OUT THE INVENTION

Figure 1:
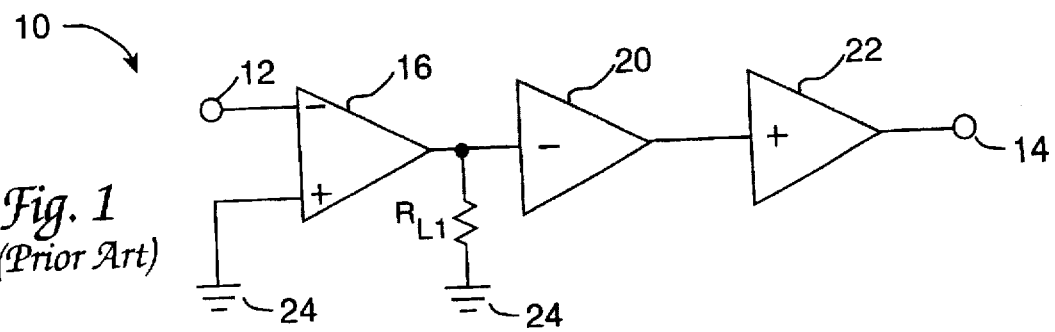
FIG. 1 is a schematic illustration of a basic amplifier of the prior art.
Figure 2:
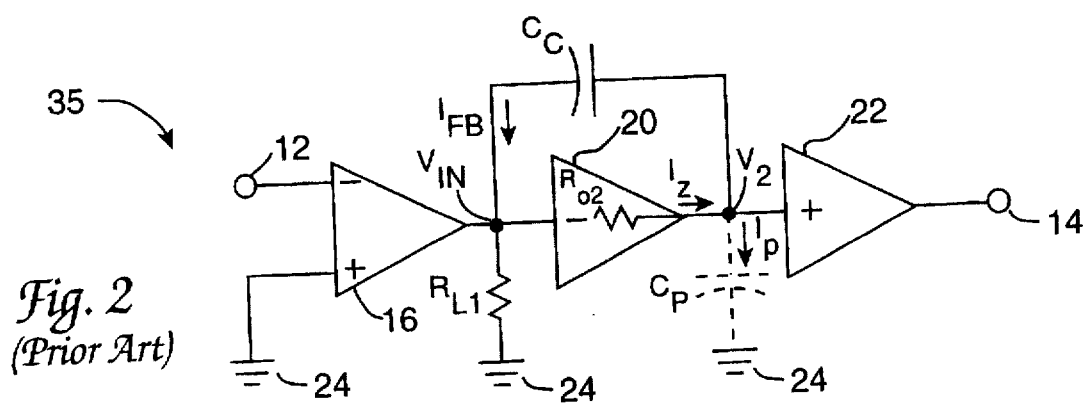
FIG. 2 is a schematic illustration of an amplifier of the prior art which improves upon the basic amplifier of FIG. 1.
Figure 3:
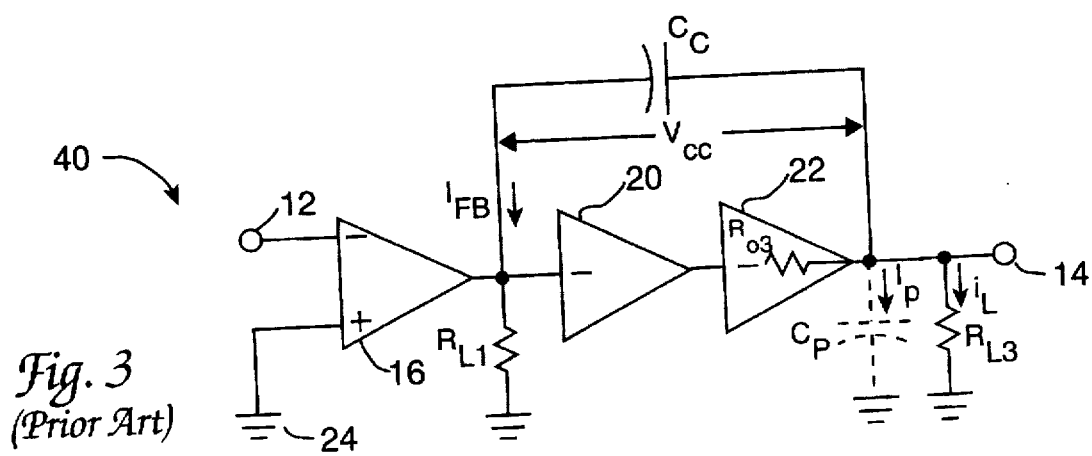
FIG. 3 is a schematic illustration of another amplifier of the prior art which improves upon the amplifier of FIG. 2.
Figure 4:
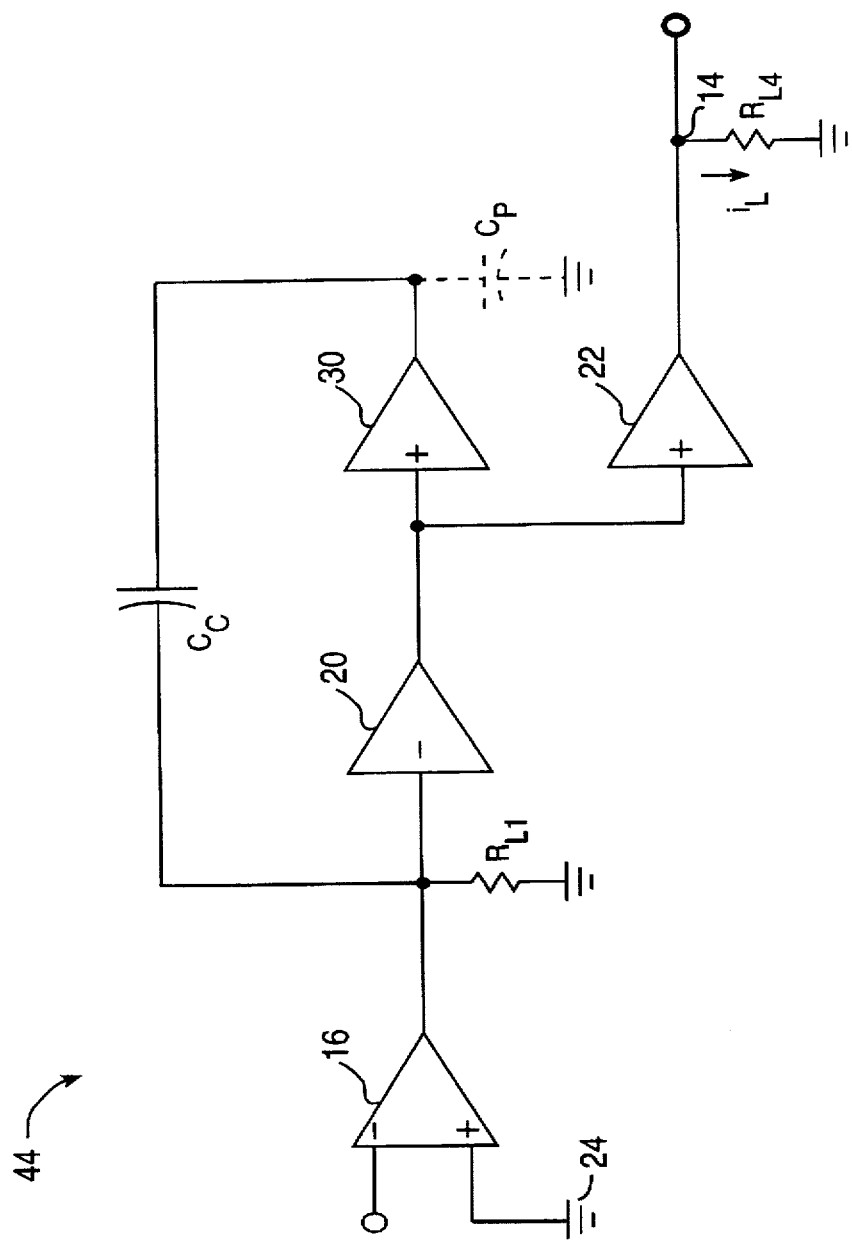
FIG. 4 is a schematic illustration of one other amplifier of the prior art.
Figure 5:
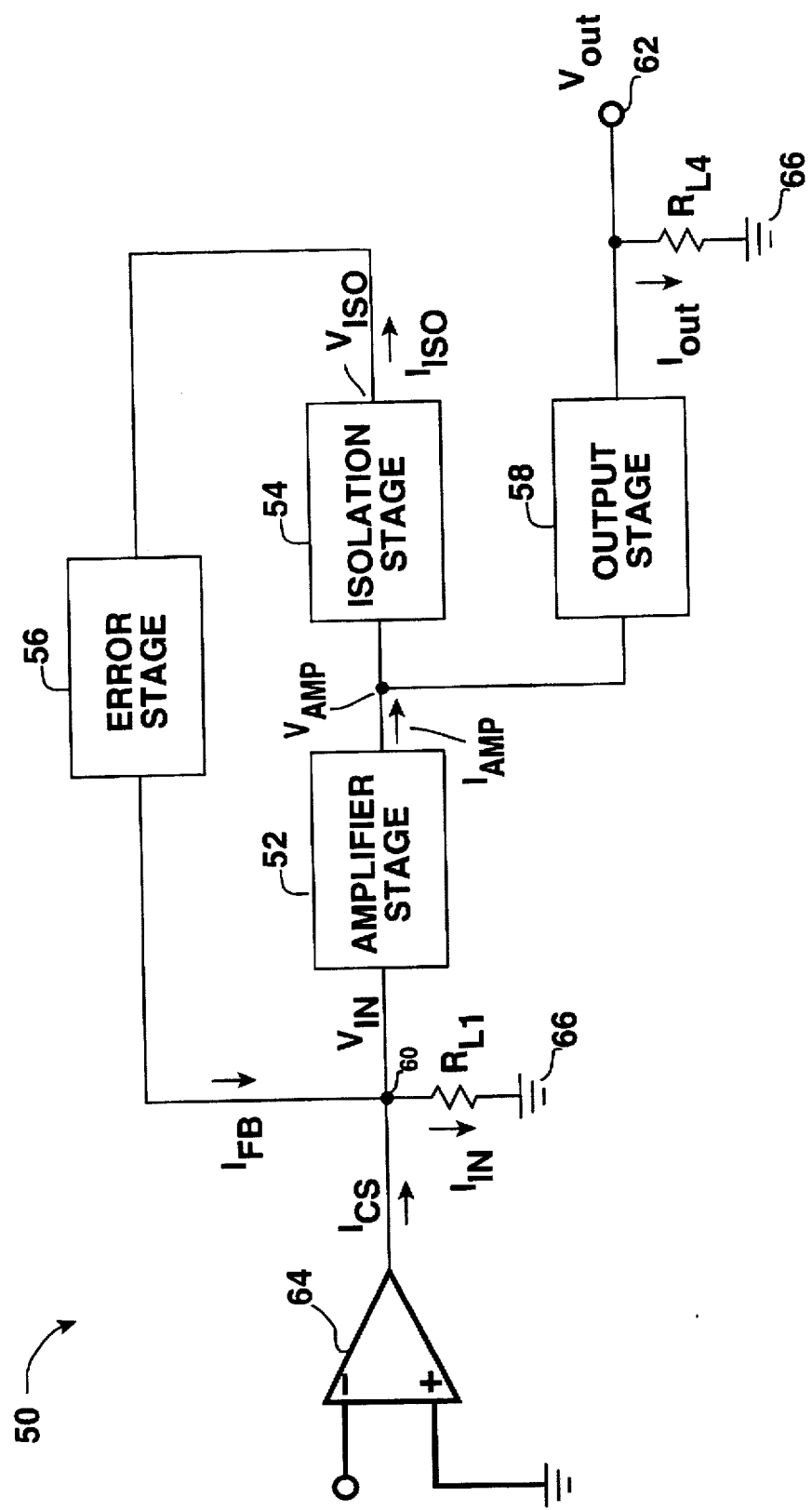
FIG. 5 is a schematic/block diagram of a dual stage output amplifier in accordance with one embodiment of the present invention.

FIGS. 1–4 illustrate the prior art. With reference to FIG. 5, a power amplifier 50 in accordance with one embodiment of the present invention will be described. The power amplifier 50 includes an amplifier stage 52, an isolation stage 54 (equivalently a second output stage), an error stage 56, an output stage 58, a power amplifier input 60, and a power amplifier output 62. Also shown in FIG. 5 is a converting stage 64, a load resistor $R_{L1}$ coupled between the power amplifier input 60 and a ground reference 66, and an output load resistor $R_{L4}$ coupled between the power amplifier output 62 and the ground reference 66. Note that, unless otherwise indicated, all voltages discussed herein are defined with reference to the ground reference 66.

A voltage signal received by the converting stage 64 is amplified and converted into a current signal $I_{CS}$. A current $I_{IN}$ is formed in part from current $I_{CS}$ and is reconverted into a voltage signal $V_{IN}$ by the load resistor $R_{L1}$. The amplifier stage 52 amplifies this input signal and generates an amplified signal having a voltage $V_{AMP}$ and a current $I_{AMP}$. The amplified signal serves to drive both the isolation stage 54 and the output stage 58. In turn, the isolation stage 54 generates an amplified signal having a voltage $V_{ISO}$ and a current $I_{ISO}$ and the output stage 58 generates an amplified signal at the power amplifier output 62 having a voltage $V_{OUT}$, and a current $I_{OUT}$ driving the load resistor $R_{LA}$.

As will be appreciated, the actual load may be a simple resistive load such as $R_{LA}$ or it may be an impedance $Z_{LA}$. The following discussion analyzes the behavior of the present invention with a resistive load. However, those skilled in the art will realize that a similar analysis may be performed and similar beneficial results will arise.

The error stage 56 is coupled across the isolation stage 54 and the input 60 and is responsive to a difference between the voltage $V_{ISO}$ and a desired voltage $V_{ISO}$ to generate a feedback current $I_{FB}$. In general, the current flowing into the amplifier stage 52 will be small enough that $I_{IN} \approx I_{FB} + I_{CS}$. The current $I_{FB}$ will "correct" $I_{IN}$ such that the difference between the voltage $V_{ISO}$ and a desired voltage $V_{ISO}$ is decreased. Furthermore, this will minimize a difference between the voltage $V_{OUT}$ and a desired voltage $V_{OUT}$ thereby minimizing distortion in the output signal.

In one suitable embodiment, the error stage 56 consists of a buffer amplifier with a unity voltage gain and a greater than unity current gain driving a capacitor $C_C$. Then, in comparison to the power amplifier 44 of FIG. 4, the current gain would reduce the current $I_{ISO}$ loading upon the isolation stage 54 for a reduction of the distortion arising from the variable output impedance of isolation stage 54.

In another embodiment, the error stage 56 includes an amplifier having a voltage gain G greater than unity driving a capacitor having a capacitance $C_C/G$. Thus the voltage gain reduces the value of the capacitance required to provide adequate phase compensation. In yet another suitable embodiment, the error stage 56 includes an amplifier having a voltage gain G and a current gain greater than unity, and a capacitor having a capacitance $C_C/G$. In this embodiment, the gains of the amplifier both reduce distortion and reduce the required feedback capacitance size.

For the purpose of analysis, the gain of the amplifier stage 52 is defined as A2, the gain of the isolation stage 54 is defined as A3, the gain of the error stage 56 is defined as $A_{ES}$, and the gain of the output stage 58 is defined as A4. Hence two meaningful total gains $A_{FB}$ and $A_T$ can be determined. The gain $A_{FB}$ is defined as a feedback gain from the input 60 through the error stage 56 back to the input 60; thus $A_{FB} = A2*A3*A_{ES}$. The gain $A_T$ is defined as the gain through the power amplifier 50; thus $A_T = A2*A4$.

In essence, the isolation stage 54 isolates the amplifier stage 52 from any parasitic capacitance in the circuit without having to supply the amplifier 50's output load current $I_{OUT}$. Similar to FIG. 3 of the prior art, the feedback gain generates a pole at a frequency $f_{C1} = 1/(2*\pi*R_{L1}*A2*A3*C_C)$. However, in contrast to FIG. 3, A3 is not subject to variations in the output load current $I_{OUT}$. Therefore the gain product A2*A3 which helps define the pole $f_{C1}$ remains immune to the effects of the output load current $I_{OUT}$. Accordingly, the phase distortion of power amplifier 50 of FIG. 5 is greatly reduced with respect to the phase distortion of power amplifier 40 of FIG. 3. Additionally, since the error stage 56 provides one of current gain greater than unity, voltage gain greater than unity, or a combination of current and voltage gain greater than unity, the power amplifier 50 has correspondingly improved characteristics over the power amplifier 44 of FIG. 4.

Figure 6:
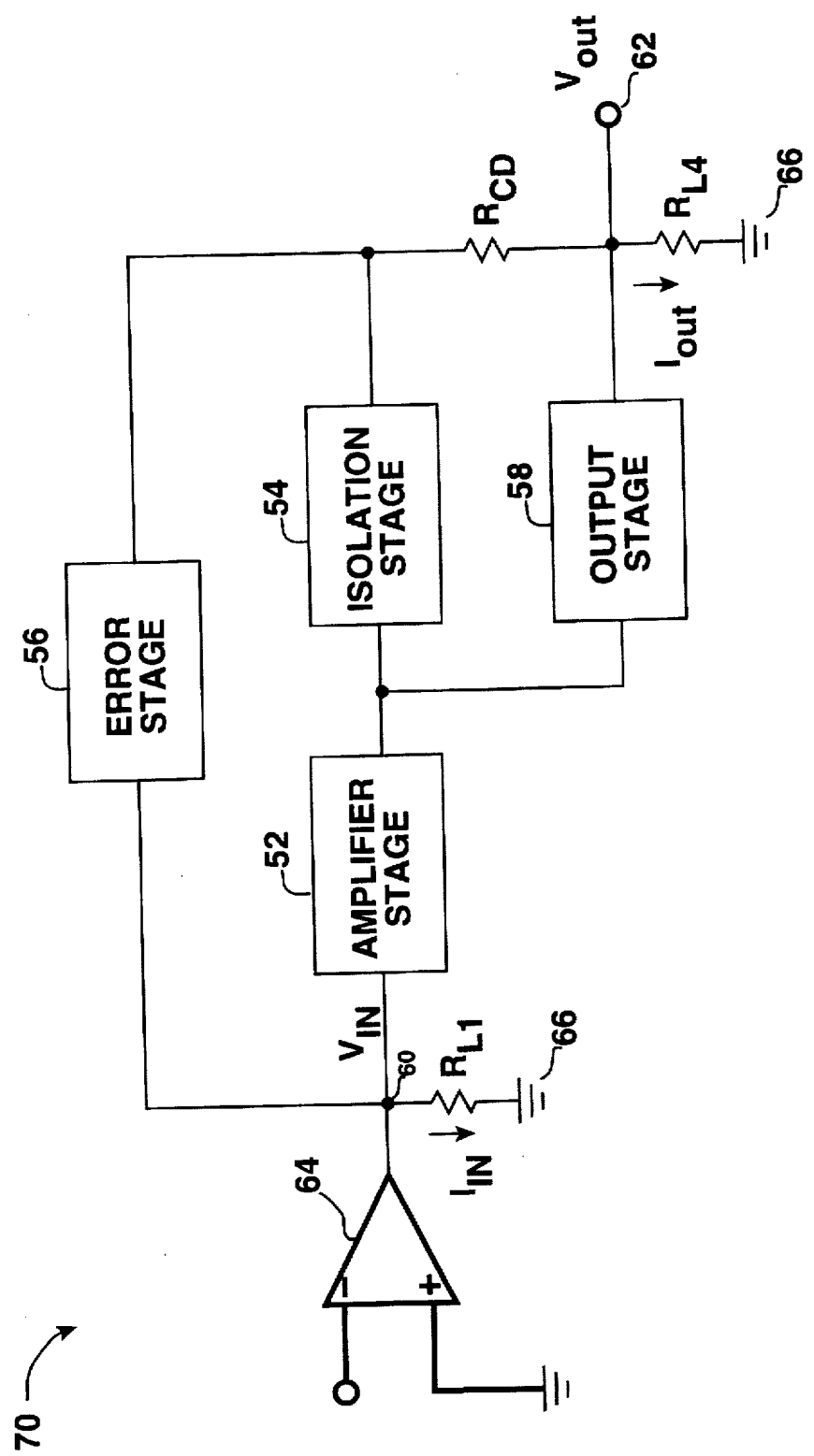
FIG. 6 is a schematic/block diagram of a dual stage output amplifier in accordance with another embodiment of the present invention.

Focusing attention on FIG. 6, one amplifier 70 in accordance with another embodiment of the present invention will be described. The amplifier 70 is a strategic modification of the amplifier 50 of FIG. 5 which permits a compromise balance between a correction in gain distortion and a correction in phase distortion. In the embodiment of FIG. 6, it is assumed that the gains A3 and A4 are equal. Furthermore, the gain $A_{ES}$ of the error stage 56 may be solely capacitive, or $A_{ES}$ may provide current gain, voltage gain, or a combination of current and voltage gain. Like names and reference numbers will be used for like elements.

In the amplifier 50 of FIG. 5, the output load current demands may cause a gain distortion through an output resistance modulation of the output stage 58. This is similar to that described above with reference to FIGS. 3 and 4. The output resistance modulation of the output stage 58 causes variation in the gain A4 which, in turn, produces gain distortion in the power amplifier gain $A_T$. However, the two parallel output stages (output stage 58 and isolation stage 54) enable a technique defined herein as "current dumping."

In the embodiment of FIG. 6, current dumping is accomplished by connecting a resistor $R_{CD}$ in series with the isolation stage 54 and the output 62. Since A3 and A4 are equivalent, in the "ideal" case, the voltages $V_{ISO}$ and $V_{OUT}$ should be equivalent. Accordingly, no current should flow across $R_{CD}$. However, as described above, the load current drawn from the output stage 58 reduces and/or distorts the gain A4, developing a voltage across $R_{CD}$. As a result of the voltage across $R_{CD}$, current flows through $R_{CD}$ supplying a portion of the load current $I_{OUT}$. Thus less current is drawn from the output stage 58, thereby improving the reduction and/or distortion in the gain A4.

Of course, $R_{CD}$ draws its current from the isolation stage 54 and thus may distort the gain A3, which, in turn, results in potential phase distortion. Therefore, the value of $R_{CD}$, should be chosen to produce a desired compromise balance between gain and phase distortion. Additionally, when the error stage 56 has a current gain greater than unity, less current $I_{ISO}$ is demanded of the isolation stage 54.

Figure 7:
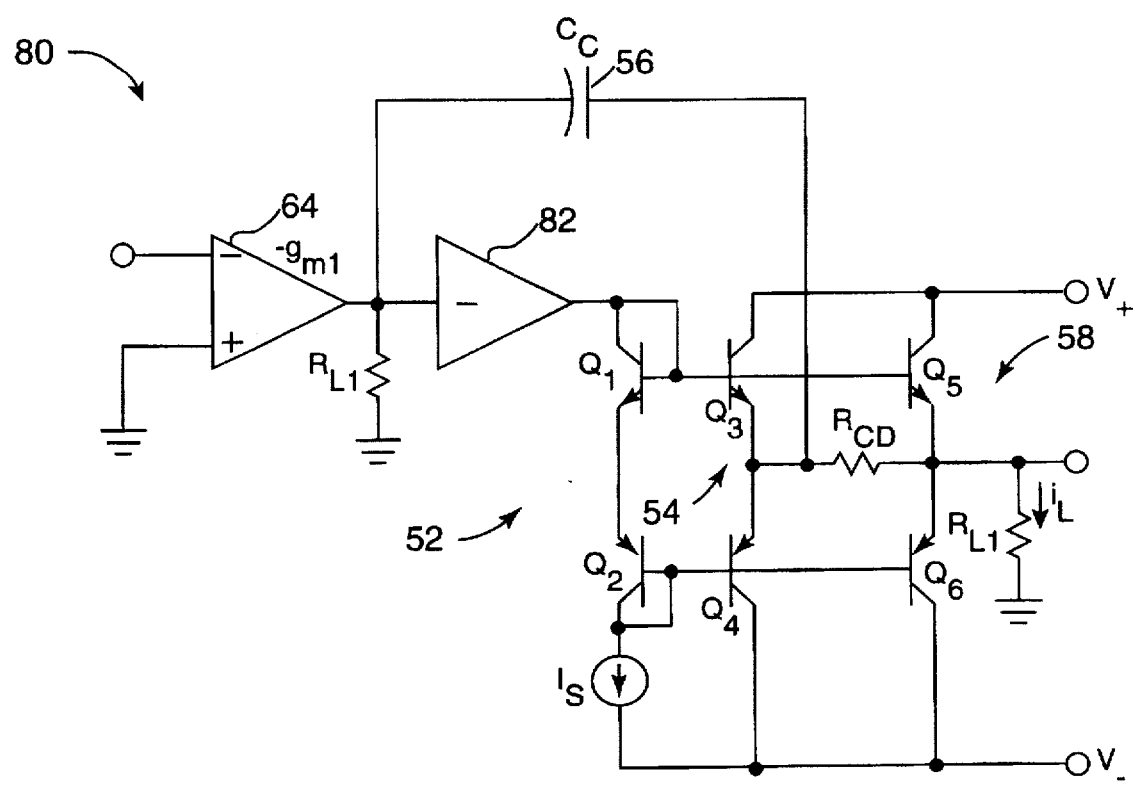
FIG. 7 is a schematic illustration of a bipolar dual stage output amplifier in accordance with yet another embodiment of the present invention.

With reference to FIG. 7, one suitable implementation of a bipolar power amplifier 80 in accordance with one embodiment of the present invention will be described. In the embodiment of FIG. 7, the amplifier stage 52 includes an amplifier 82, two diode-connected transistors Q1 and Q2, and a current source $I_S$. The amplifier 82 can be one of a variety of standard construction well familiar to those skilled in the art, as well as any other amplifier designed for a particular application. The transistors Q1 and Q2, together with the current source $I_S$ provide a common bias current supply for the two output stages 54 and 58.

Transistors Q3 and Q4 form the isolation stage 54, driving the error stage 56 and the optional current dumping resistor $R_{CD}$. Transistors Q5 and Q6 form the output stage 58 which serves as the primary source of the load current $I_{OUT}$. Both of these stages 54 and 58 are powered from a bipolar power source of voltage V+ and V−.

As will be appreciated, in the embodiment of FIG. 7, both the isolation stage 54 and the output stage 58 are what is termed in the art "open loop." That is, they do not include any internal error correction mechanism. While open loop operation of the amplifiers may be suitable for some applications, other applications may require a more robust mechanism. In particular, the output stage 58 will be more likely than the isolation stage 54 to require error correction. This is due, in part, to the error correction provided to the isolation stage 54 by the error stage 56 and the larger current requirements of the output stage 58.

Figure 8:
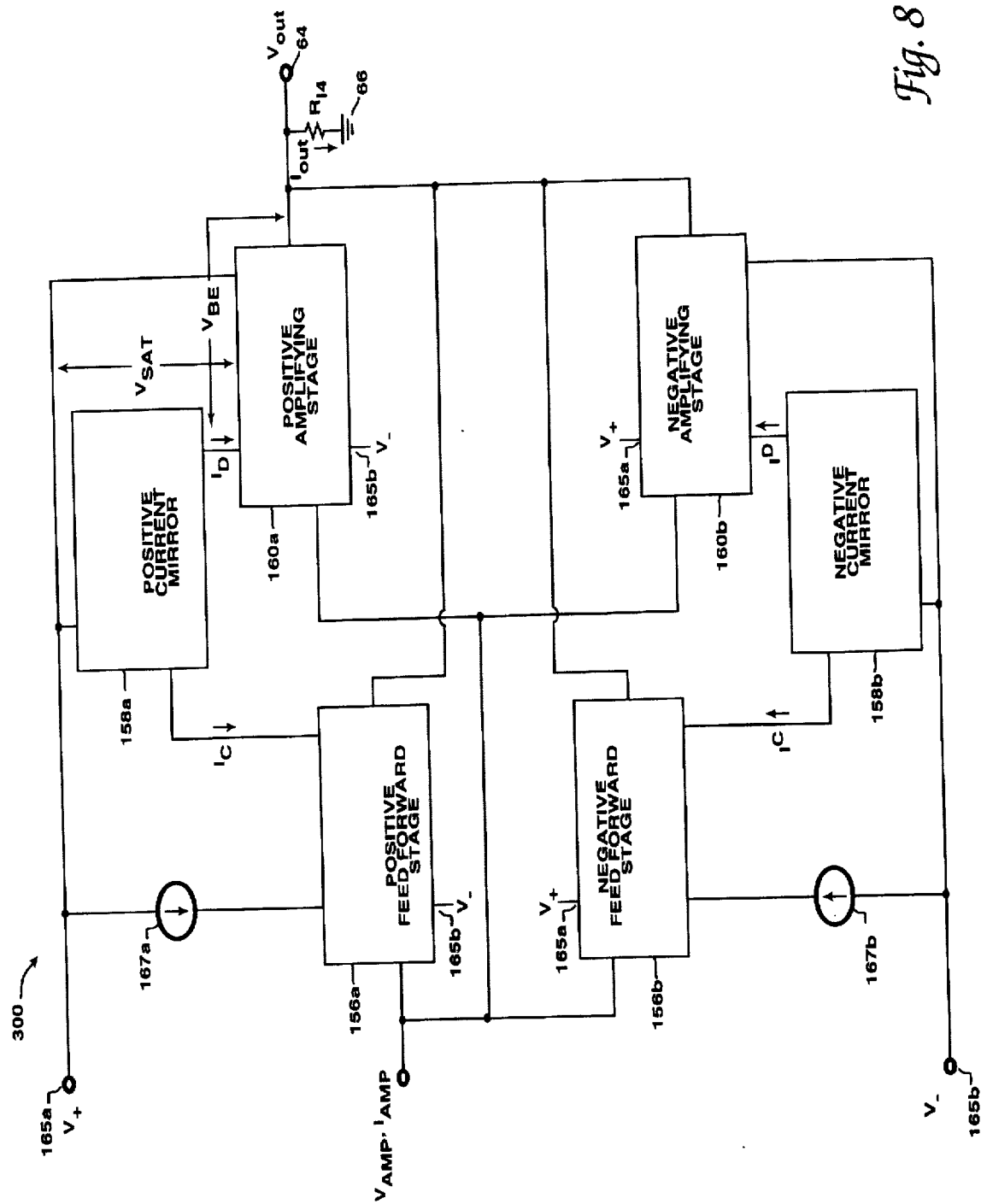
FIG. 8 is a schematic illustration showing in more detail one bipolar output stage in accordance with still another embodiment of the present invention, the bipolar output stage suitable for use as isolation stage 54 or output stage 58 of FIGS. 5 and 6.

With reference to FIG. 8, a bipolar output stage 300 in accordance with a further embodiment of the present invention will now be described. The bipolar output stage 300 is well suited for applications where a current efficient output stage is required and may be used for either isolation stage 54, output stage 58, or two separate instances of output stage 300 may be used for both.

The bipolar output stage 300 can be figuratively divided into two circuits: a first circuit which provides a positive component of the output current $I_{out}$; and a second circuit (which is a mirror of the first set) which provides a negative component of the output current $I_{out}$. Elements of the first circuit of the output stage 300 are indicated with the marker "a" appended to their respective reference numbers while the mirrored elements are indicated with the marker "b" appended to their respective reference numbers. To further distinguish, the modifying terms "positive" and "negative" have been added to the names of the different stages.

The output stage 300 includes positive and negative feedforward stages 156a and 156b, positive and negative current mirror stages 158a and 158b, positive and negative amplifying stages 160a and 160b, and positive and negative bias current sources 167a and 167b. Also shown are voltage power sources V+ 165a and V- 165b providing power to the bipolar output stage 300.

Describing the behavior of the first circuit, the positive current mirror 158a provides a variable, demand driven biasing current to the positive amplifying stage 160a as follows. When the positive feedforward stage 156a senses a voltage difference between the amplified signal and the output signal, the positive feedforward stage 156a increases the current control signal $I_c$ correspondingly.

In response, the positive current mirror 158a mirrors and amplifies $I_c$ to generate a correspondingly larger demand driven current signal $I_d$. This raises the bias current $I_d$ to the positive amplifying stage 160a enabling the positive amplifying stage 160a to increase the output current $I_{out}$, thereby increasing $V_{out}$. Similarly, as the output voltage $V_{out}$ decreases corresponding to a decrease in $V_{in}$, then the demand driven current $I_d$ will decrease. In an identical manner as described above, the second circuit is arranged to generate a negative current $I_{OUT}$. Thus power amplifier 300 can generate a bipolar output signal.

By varying the demand current $I_d$ as described, the bipolar output stage 300 is able to generate an output signal in a current efficient manner. In addition, the output stage 300 is voltage efficient as the maximum $V_{OUT}=V+-V_{SAT}-V_{BE}$, where $V_{SAT}$ is the maximum voltage drop across the positive current mirror 158a and $V_{BE}$ is a voltage drop across a standard amplifier.

For more details on the behavior of the bipolar amplifier 300 as well as suitable embodiments of the circuit, please see Smith's copending United States Provisional patent application Ser. No. 60/000,726, entitled "AN OUTPUT STAGE FOR BUFFERING AN ELECTRICAL SIGNAL AND METHOD FOR PERFORMING THE SAME", filed on Jun. 30, 1995.

Figure 9:
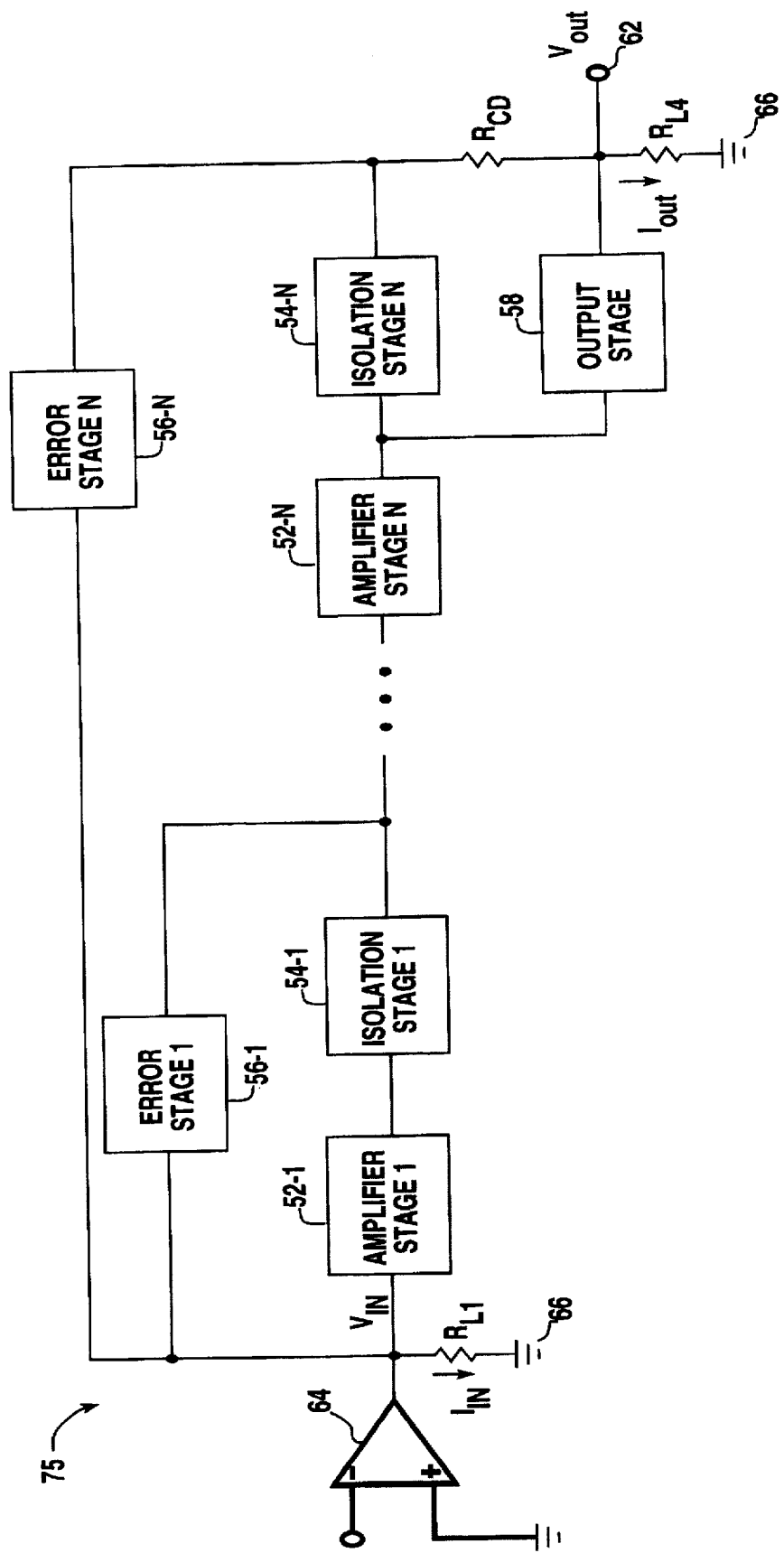
FIG. 9 is a schematic/block diagram of a multi-stage amplifier in accordance with another embodiment of the present invention.

Turning next to FIG. 9, a multi-stage amplifier 75 in accordance with another embodiment of the present invention will be described. A core concept of the present invention is the isolation of a signal driving an error stage from unnecessary loads which may result in phase distortion and/or gain distortion. While the embodiments of FIGS. 5 and 6 illustrate this concept of the present invention, it will be appreciated that this concept can be suitably applied in other circuits. For example, it is sometimes necessary or preferable to design an amplifier with multiple stages of amplification. Such is the case in FIG. 9.

FIG. 9 includes an integer N number of stages of amplification. According to the present invention, the multi-stage amplifier 75 includes an amplifier stage 1 52–1, an isolation stage 1 54–1, an error stage 1 56–1, and so forth, on up to amplifier stage N 52–N, an isolation stage N 54–N, and an error stage 1 56–N. Thus each error stage i 56–i (where $1 \leq i < N$) is isolated from its corresponding amplifier stage i 52–i and further from the output stage 58. The output stage 58 is driven by the output of the final amplifier stage N 52–N and an optional current dumping resistor $R_{CD}$ is coupled between the output 62 and the output of the final isolation stage N 54–N.

Analysis similar to that performed above with reference to FIGS. 5 and 6 demonstrates that the multi-stage amplifier 75 of FIG. 9 will exhibit the desired low distortion behavior. As this is apparent from the preceding discussion, no further details will be provided. Although only a few embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein.

I claim:

1. A dual-output stage amplifier comprising:
    an amplifier stage having an input and an output;
    an error stage having an input and an output, the error stage having a gain operable to amplify an electrical signal applied at the error stage input, the error stage gain being selected from the group consisting of gains having a current gain greater than unity and gains having a voltage gain greater than unity;
    a first output stage having an input and an output, the first output stage output being coupled with the output of the amplifier stage and responsive to the amplifier stage, whereby when the first output stage output is coupled to an output load the first output stage is capable of providing an output current to the output load such that a first output voltage related to an input voltage at the input of the amplifier stage is maintained across the output load; and
    a second output stage having an input and an output, the second output stage input being coupled with the output of the amplifier stage in parallel with the first output stage, the second output stage output being coupled to the input of the error stage, the output of the error stage being coupled to the input of the amplifier stage, whereby the error stage is capable of providing a feedback current to the amplifier stage input such that a difference between a second output voltage generated by the second output stage and a desired second output voltage is reduced.

2. A dual-output stage amplifier as recited in claim 1 wherein the first output stage and the second output stage have an equivalent voltage gain such that a desired first output voltage and the desired second output voltage are equal, and wherein the providing of the feedback current further serves to reduce a difference between the first output voltage and the desired first output voltage.

3. A dual-output stage amplifier as recited in claim 1 wherein the first output stage output and the second output stage output are electrically isolated whereby no current generated by the second output stage is provided to the output load.

4. A dual-output stage amplifier as recited in claim 1 wherein the first output stage output and the second output stage output are electrically connected through a current dumping resistor whereby a difference between the first output voltage and the second output voltage will cause a current $I_{CD}$ to flow through the current dumping resistor, the current $I_{CD}$ thereby being provided to the output load.

5. A multiple amplification stage amplifier comprising:

an input amplification stage having an input and an output;

a successive plurality of amplification stages each having an input and an output, the input of a first one of the successive plurality of amplification stages being connected to the output of the input amplification stage and, with an exception of a last one of the successive plurality of amplification stages, the output of any given amplification stage being connected to the input of a next amplification stage immediately subsequent to the given amplification stage;

a plurality of errors stages each having an input and an output, wherein each error stage corresponds to a unique one of the successive plurality of amplification stages, each error stage output being connected to the input amplification stage input and each error stage input being connected to the output of its corresponding unique amplification stage, whereby any given error stage is capable of providing a feedback current to the amplification stage input such that a difference between a voltage generated at the output of its corresponding amplification stage and a desired voltage is reduced; and an output stage having an input and an output, the output stage input being coupled with the input of the last amplification stage, whereby, when the output stage output is coupled to an output load, the output stage is capable of providing an output current to the output load such that an output voltage related to an input voltage at the input of the input amplification stage is maintained across the amplifier load, and wherein the output stage and the last amplification stage output are electrically isolated such that no current generated by the last amplification stage is provided to the output load.

6. A multiple amplification stage amplifier as recited in claim 5 wherein the last amplification stage and the output stage have an equivalent voltage gain such that a desired output voltage and a desired voltage at the output of the last amplification stage are equal, and wherein the providing of feedback current from the plurality of error stages further serves to reduce a difference between the output voltage and the desired output voltage.

7. A multiple amplification stage amplifier comprising:

an input amplification stage having an input and an output;

a successive plurality of amplification stages each having an input and an output, the input of a first one of the successive plurality of amplification stages being connected to the output of the input amplification stage and, with an exception of a last one of the successive plurality of amplification stages, the output of any given amplification stage being connected to the input of a next amplification stage immediately subsequent to the given amplification stage;

a plurality of errors stages each having an input and an output, wherein each error stage corresponds to a unique one of the successive plurality of amplification stages, each error stage output being connected to the input amplification stage input and each error stage input being connected to the output of its corresponding unique amplification stage, whereby any given error stage is capable of providing a feedback current to the amplification stage input such that a difference between a voltage generated at the output of its corresponding amplification stage and a desired voltage is reduced;

an output stage having an input and an output, the output stage input being coupled with the input of the last amplification stage, whereby, when the output stage output is coupled to an output load, the output stage is capable of providing an output current to the output load such that an output voltage related to an input voltage at the input of the input amplification stage is maintained across the amplifier load: and wherein the output stage output and the last amplification stage output are electrically connected through a current dumping resistor, whereby a difference between the output voltage and a voltage at the last amplification stage output will cause a current $I_{CD}$ to flow through the current dumping resistor, the current $I_{CD}$ thereby being provided to the output load.

8. A multiple amplification stage amplifier comprising:

an input amplification stage having an input and an output;

a successive plurality of amplification stages each having an input and an output, the input of a first one of the successive plurality of amplification stages being connected to the output of the input amplification stage and, with an exception of a last one of the successive plurality of amplification stages, the output of any given amplification stage being connected to the input of a next amplification stage immediately subsequent to the given amplification state;

a plurality of errors stages each having an input and an output, wherein each error stage corresponds to a unique one of the successive plurality of amplification stages, each error stage output being connected to the input amplification stage input and each error stage input being connected to the output of its corresponding unique amplification stage, whereby any given error stage is capable of providing a feedback current to the amplification stage input such that a difference between a voltage generated at the output of its corresponding amplification stage and a desired voltage is reduced:

an output stage having an input and an output, the output stage input being coupled with the input of the last amplification stage, whereby, when the output stage output is coupled to an output load, the output stage is capable of providing an output current to the output load such that an output voltage related to an input voltage at the input of the input amplification stage is maintained across the amplifier load; and wherein each of the plurality of successive amplification stages includes:

an amplifier stage having a voltage gain greater than unity, the amplifier stage having an input and an output, the input of the amplifier stage being the input of the amplification stage; and an isolation stage having a voltage gain of unity, the isolation stage having an input coupled to the output of the amplifier stage and an output which is the output of the amplification stage.

9. A power amplifier comprising:

a power amplifier input coupled to an input signal having a voltage $V_{IN}$ and a current $I_{IN}$;

a power amplifier output at which an output signal is generated having a voltage $V_{OUT}$ and a current $I_{OUT}$;

an amplifier stage coupled to the power amplifier input and responsive to the input signal to generate an amplified signal having a voltage $V_{AMP}$ and $I_{AMP}$;

an isolation stage coupled to the amplifier stage and responsive to the amplified signal to generate an isolated signal having a voltage $V_{ISO}$ and $I_{ISO}$;

an error stage coupled between the isolation stage and the power amplifier input and responsive to a difference between the $V_{ISO}$ and a desired $V_{ISO}$ to generate a feedback current $I_{FB}$ operative to modify the input signal such that the difference between the $V_{ISO}$ and the desired $V_{ISO}$ is minimized and a difference between the $V_{OUT}$ and a desired $V_{OUT}$ is also minimized;

an output stage coupled between the amplifier stage and the power amplifier output and responsive to the amplified signal to generate the output signal; and a current dumping resistor $R_{CD}$ coupled between the isolation stage and the power amplifier output such that a voltage difference between $V_{ISO}$ and $V_{OUT}$ generates a current flowing through the resistor $R_{CD}$ which is included in $I_{OUT}$.

10. A power amplifier as recited in claim 9 further comprising:

a converting stage coupled to the power amplifier input, the converting stage being arranged to receive a voltage and convert the voltage into a current $I_{CS}$ such that $I_{IN} \approx I_{CS} + I_{FB}$; and a load resistor $R_{L1}$ coupled between the power amplifier input and a ground reference such that the current $I_{IN}$ flows through the load resistor $R_{L1}$, thereby generating the voltage VIN.

11. A power amplifier as recited in claim 9 wherein the error stage includes a capacitor coupled in series between the isolation stage and the amplifier input.

12. A power amplifier as recited in claim 9 wherein the error stage includes a buffer amplifier and a capacitor coupled in series between the isolation stage and the amplifier input.

13. A power amplifier as recited in claim 12 wherein the buffer amplifier has a voltage gain greater than unity.

14. A power amplifier as recited in claim 12 wherein the buffer amplifier has a current gain greater than unity.

15. A power amplifier comprising:

a power amplifier input coupled to an input signal having a voltage $V_{IN}$ and a current $I_{IN}$;

a power amplifier output at which an output signal is generated having a voltage $V_{OUT}$ and a current $I_{OUT}$;

an amplifier stage coupled to the power amplifier input and responsive to the input signal to generate an amplified signal having a voltage $V_{AMP}$ and $I_{AMP}$;

an isolation stage coupled to the amplifier stage and responsive to the amplified signal to generate an isolated signal having a voltage $V_{ISO}$ and $I_{ISO}$;

an error stage coupled between the isolation stage and the power amplifier input and responsive to a difference between the $V_{ISO}$ and a desired $V_{ISO}$ to generate a feedback current $I_{FB}$ operative to modify the input signal such that the difference between the $V_{ISO}$ and the desired $V_{ISO}$ is minimized and a difference between the $V_{OUT}$ and a desired $V_{OUT}$ is also minimized;

an output stage coupled between the amplifier stage and the power amplifier output and responsive to the amplified signal to generate the output signal;

a current dumping resistor $R_{CD}$ coupled between the isolation stage and the power amplifier output such that a voltage difference between $V_{ISO}$ and $V_{OUT}$ generates a current flowing through the resistor $R_{CD}$ which is included in $I_{OUT}$; and wherein the amplifier stage is a bipolar amplifier stage which includes:

an amplifying device having an input coupled to the power amplifier input and an output coupled to both the isolation stage and the output stage;

a first transistor having a collector, a base, and an emitter, the base and the collector of the first transistor coupled together and to the output of the amplifying device;

a second transistor having a collector, a base, and an emitter, the base and the collector of the second transistor coupled together and to both the isolation stage and the output stage, the emitter of the first transistor coupled to the emitter of the second transistor; and a substantially constant current source having a first active terminal and a second active terminal and current flowing therebetween, the first active terminal coupled to the collector of the second transistor and the second active terminal coupled to a voltage supply V–, wherein the amplifying device is arranged to amplify the voltage $V_{IN}$ to generate the voltage $V_{AMP}$ and the first and second transistor, operating together with the substantially constant current source and the amplifying device, are operative to provide the current $I_{AMP}$.

16. A power amplifier as recited in claim 15 wherein the isolation stage includes:

a third transistor having a collector, a base, and an emitter, the collector of the third transistor coupled to a voltage supply V+, the base of the third transistor coupled to the output of the amplifying device, and the emitter of the third transistor coupled to the error stage;

a fourth transistor having a collector, a base, and an emitter, the collector of the fourth transistor coupled to the voltage supply V–, the base of the fourth transistor coupled to the base of the second transistor, and the emitter of the fourth transistor coupled to the error stage.

17. A power amplifier as recited in claim 15 wherein the output stage includes:

a third transistor having a collector, a base, and an emitter, the collector of the third transistor being coupled to a voltage supply V+, the base of the third transistor being coupled to the output of the amplifying device, and the emitter of the third transistor being coupled to the power amplifier output; and a fourth transistor having a collector, a base, and an emitter, the collector of the fourth transistor being coupled to the power supply V–, the base of the fourth transistor being coupled to the base of the second transistor, and the emitter of the fourth transistor being coupled to the power amplifier output.

18. A method for amplifying electrical signals comprising the steps of:

receiving an input signal having a voltage $V_{IN}$ and a current $I_{IN}$;

generating an amplified signal having a voltage $V_{AMP}$ and a current $I_{AMP}$ related to the input signal;

generating an isolated signal having a voltage $V_{ISO}$ and a current $I_{ISO}$ related to the amplified signal;

generating an output signal having a voltage $V_{OUT}$ related to the amplified signal and a current $I_{OUT}$ related to an output load;

sensing a difference between the voltage $V_{ISO}$ and a desired $V_{ISO}$;

generating a feedback current $I_{FB}$ related to the difference between the voltage $V_{ISO}$ and the desired $V_{ISO}$; and electrically coupling $V_{OUT}$ and $V_{ISO}$ through a resistor such that when there is a voltage difference between $V_{OUT}$ and $V_{ISO}$ a portion of the current $I_{ISO}$ is included in the current $I_{OUT}$, and wherein when the current $I_{FB}$ is included into the current $I_{IN}$ the difference between the voltage $V_{ISO}$ and the desired $V_{ISO}$ is minimized and further a difference between the voltage $V_{OUT}$ and a desired $V_{OUT}$ is minimized.

* * * * *

UNITED STATES PATENT AND TRADEMARK OFFICE
CERTIFICATE OF CORRECTION

PATENT NO. : 5,736,900
DATED : April 7, 1998
INVENTOR(S) : Smith

It is certified that error appears in the above-indentified patent and that said Letters Patent is hereby corrected as shown below:

Column 2, line 45, change "Cc" to --$C_c$--

Column 12, line 33, change "state" to --stage--

Signed and Sealed this

Sixth Day of April, 1999

Attest:

Attesting Officer

Q. TODD DICKINSON

Acting Commissioner of Patents and Trademarks